(12) United States Patent
Balaraman et al.

(10) Patent No.: US 10,304,697 B2
(45) Date of Patent: May 28, 2019

(54) ELECTRONIC DEVICE WITH TOP SIDE PIN ARRAY AND MANUFACTURING METHOD THEREOF

(71) Applicant: Amkor Technology, Inc., Tempe, AZ (US)

(72) Inventors: Devarajan Balaraman, Apex, NC (US); Daniel Richter, Goldsboro, NC (US); Greg Hames, Raleigh, NC (US); Dean Zehnder, Hillsborough, NC (US); Glenn Rinne, Apex, NC (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/725,938

(22) Filed: Oct. 5, 2017

(65) Prior Publication Data

US 2019/0109018 A1    Apr. 11, 2019

(51) Int. Cl.
*H01L 21/48* (2006.01)
*H01L 21/56* (2006.01)
*H01L 23/31* (2006.01)
*H01L 23/498* (2006.01)

(52) U.S. Cl.
CPC .......... *H01L 21/4853* (2013.01); *H01L 21/56* (2013.01); *H01L 21/565* (2013.01); *H01L 23/3121* (2013.01); *H01L 23/49811* (2013.01); *H01L 2224/48091* (2013.01); *H01L 2224/48137* (2013.01); *H01L 2224/73265* (2013.01)

(58) Field of Classification Search
CPC ......... H01L 21/44; H01L 24/11; H01L 24/13; H01L 21/48; H01L 21/56; H01L 23/31; H01L 23/498; H01L 21/4853; H01L 21/565

USPC .......... 257/737, 738; 438/612, 613
See application file for complete search history.

(56) References Cited

U.S. PATENT DOCUMENTS

| | | | |
|---|---|---|---|
| 5,447,264 A * | 9/1995 | Koopman | B23K 1/0016 228/56.3 |
| 7,427,557 B2 * | 9/2008 | Rinne | H01L 24/11 257/E21.508 |
| 7,994,043 B1 * | 8/2011 | Mis | H01L 24/11 438/612 |
| 2005/0215045 A1 * | 9/2005 | Rinne | H01L 24/11 438/614 |
| 2006/0205170 A1 * | 9/2006 | Rinne | H01L 27/016 438/381 |
| 2015/0145123 A1 | 5/2015 | Ha | |
| 2015/0340332 A1 * | 11/2015 | Rinne | H01L 24/13 257/737 |
| 2016/0056055 A1 * | 2/2016 | Ko | H01L 23/562 438/107 |
| 2017/0162535 A1 * | 6/2017 | Rinne | H01L 24/11 |

FOREIGN PATENT DOCUMENTS

JP     06-177208 A     6/1994

* cited by examiner

*Primary Examiner* — Alexander O Williams
(74) *Attorney, Agent, or Firm* — McAndrews, Held & Malloy, Ltd.

(57) ABSTRACT

An electronic device and a manufacturing method thereof. As non-limiting examples, various aspects of this disclosure provide an electronic device having a top side pin array, for example which may be utilized for three-dimensional stacking, and a method for manufacturing such an electronic device.

19 Claims, 10 Drawing Sheets

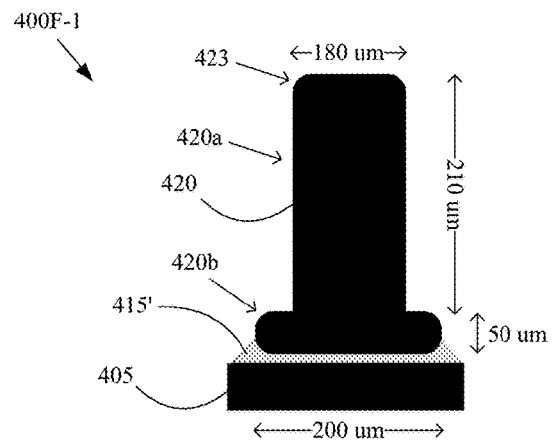
Figure 4F-1
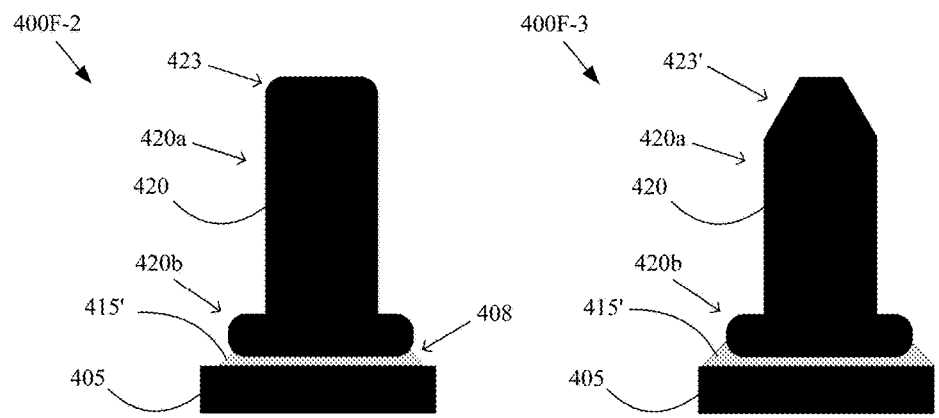
Figure 4F-2
Figure 4F-3

ELECTRONIC DEVICE WITH TOP SIDE PIN ARRAY AND MANUFACTURING METHOD THEREOF

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 4A to 4F-3 show cross-sectional views illustrating an example electronic device and an example method of making an example electronic device, in accordance with various aspects of the present disclosure.

SUMMARY

Figure 1:
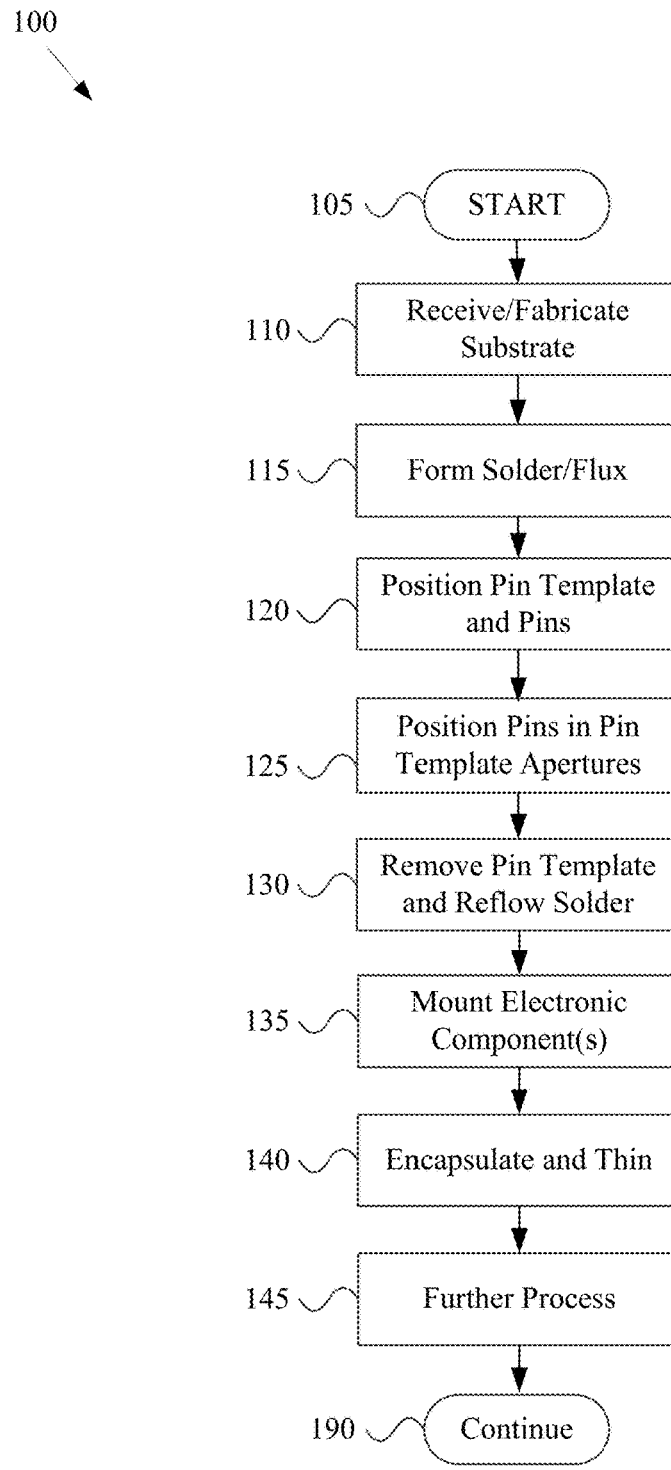
FIG. 1 shows a flow diagram of an example method of making an electronic device, in accordance with various aspects of the present disclosure.

Various aspects of this disclosure provide an electronic device and a manufacturing method thereof. As non-limiting examples, various aspects of this disclosure provide an electronic device having a top side pin array, for example which may be utilized for three-dimensional stacking, and a method for manufacturing such an electronic device.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "top," "upper," "bottom," "lower," "lateral," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

Various aspects of the present disclosure provide an electronic device (e.g., a semiconductor device, etc.) and a manufacturing (or fabricating or making) method thereof, which can decrease the cost, increase the reliability, and/or increase the manufacturability of the electronic device.

Various aspects of the present disclosure also provide a method of manufacturing an electronic device (and an electronic device manufactured thereby) that includes receiving a substrate that comprises a plurality of pads. A plurality of solder members may be formed, where each solder member of the plurality of solder members is positioned on a respective pad of the plurality of pads. A pin template comprising a plurality of apertures may be provided, and positioned above the substrate, where each aperture of the plurality of apertures is aligned with a respective pad of the plurality of pads. A plurality of pins may be provided, where each pin of the plurality of pins is positioned in a respective aperture of the plurality of apertures. The pin template may be removed from the pins and the solder members reflowed.

Various aspects of the present disclosure additionally provide a method of manufacturing an electronic device (and an electronic device manufactured thereby) that includes receiving a substrate that comprises a plurality of pads. A pin template and a plurality of pins may be provided above the substrate, where the pin template comprises a plurality of apertures and each pin of the plurality of pins is positioned in a respective aperture of the plurality of apertures and aligned with a respective pad of the plurality of pads. Each pin of the plurality of pins may be attached to its respective pad.

Various aspects of the present disclosure further provide a method of manufacturing an electronic device (and an electronic device manufactured thereby) that includes providing a pin template comprising a plurality of apertures. The pin template may be positioned above a substrate, where the substrate comprises a plurality of pads. A plurality of pins may be provided, where each pin of the plurality of pins is positioned in a respective aperture of the plurality of apertures and aligned with a respective pad of the plurality of pads. Each pin of the plurality of pins may be soldered to its respective pad.

The above and other aspects of the present disclosure will be described in or be apparent from the following description of various example implementations. Various aspects of the present disclosure will now be presented with reference to accompanying drawings, such that those skilled in the art may readily practice the various aspects.

FIG. 1 shows a flow diagram of an example method 100 of making an electronic device (e.g., a semiconductor package, etc.), in accordance with various aspects of the present disclosure. The example method 100 may, for example, share any or all characteristics with any other example method(s) discussed herein (e.g., the example method 300 of FIG. 3, of FIGS. 4A to 4F-3, of FIGS. 5A to 5C, etc.) or any portion thereof. FIGS. 2A to 2I-2 show cross-sectional views illustrating an example electronic device (e.g., a semiconductor package, etc.) and an example method of making an example electronic device, in accordance with various aspects of the present disclosure. FIGS. 2A to 2I-2 may, for example, illustrate an example electronic device at various blocks (or steps) of the method 100 of FIG. 1. FIG. 1 and FIGS. 2A to 2I-2 will now be discussed together. It should be noted that the order of the example blocks of the method 100 may vary without departing from the scope of this disclosure.

The example method 100 may begin executing at block 105. The method 100 may begin executing in response to any of a variety of causes or conditions, non-limiting examples of which are provided herein. For example, the method 100 may begin executing automatically in response to one or more signals received from one or more upstream and/or downstream manufacturing stations, in response to a signal from a central manufacturing line controller, upon arrival of components and/or manufacturing materials utilized during performance of the method 100, etc. Also for example, the method 100 may begin executing in response to an operator command to begin. Additionally for example, the method 100 may begin executing in response to receiving execution flow from any other method block (or step) discussed herein.

The example method 100 may, at block 110, comprise receiving, fabricating, and/or preparing a substrate. Block 110 may comprise receiving, fabricating, and/or preparing a substrate in any of a variety of manners, non-limiting examples of which are provided herein. Various example aspects of block 110 are presented in the example 200A shown at FIG. 2A.

The received, fabricated, and/or prepared substrate may comprise any of a variety of characteristics. For example, the received, fabricated, and/or prepared substrate may comprise a plurality of substrates in a wafer from (e.g., as or on a silicon or other semiconductor wafer, as or on a glass wafer or panel, as or on a metal wafer or panel, etc.). Though the examples illustrated and discussed herein generally show a single substrate for illustrative clarity, at any or all of the process steps shown herein, the substrate may be one of a plurality of connected substrates and the steps may be performed similarly on each of the plurality of connected substrates.

In the examples shown herein, the substrate may, for example, only include electrical routing circuitry (e.g., without active semiconductor components and/or passive components, etc.). Note, however, that the scope of this disclosure is not limited thereto. For example, the substrate may, for example, include (or be) a semiconductor die that has active semiconductor circuitry. Also for example, the substrate may comprise passive electronic components (e.g., resistors, capacitors, inductors, integrated passive devices (IPDs), etc.) and/or active electronic components (e.g., transistors, logic circuits, semiconductor processing components, semiconductor memory components, etc.) and/or optical components, etc.

Figure 2A:
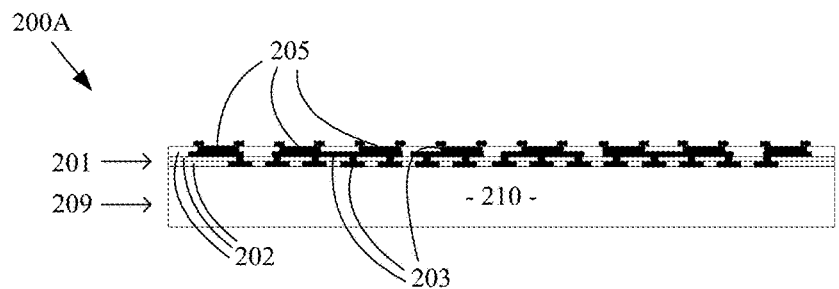
FIGS. 2A to 2I-2 show cross-sectional views illustrating an example electronic device and an example method of making an example electronic device, in accordance with various aspects of the present disclosure.

The example 200A of FIG. 2A shows a substrate 210 comprising a support layer 209 (or carrier). The support layer 209 may, for example, comprise any of a variety of materials (e.g., silicon or other semiconductor material, glass, metal, plastic, etc.). The support layer 209 may, for example, be temporary or sacrificial (e.g., a temporary carrier, etc.).

The example substrate also comprises a signal distribution structure 201 (or signal redistribution structure) on the support layer 209. The example signal distribution structure 201, comprises a plurality of dielectric layers 202 and a plurality of conductive layers 203. The signal distribution structure 201 may comprise any of a variety of characteristics. For example, the signal distribution structure may comprise back-end-of-line (BEOL) signal distribution layers from a die fabrication process, may also or alternatively comprise signal distribution layers formed in an electronic component packaging process (e.g., formed directly on a semiconductor die or die pads thereof, formed on one or more BEOL signal distribution layers, etc.).

The example conductive layers 203, for example, include conductive pads 205. As shown herein, such conductive pads 205 may, for example, be utilized for pin attachment, die attachment, etc.

The conductive pads 205 may comprise any of a variety of characteristics. The conductive pads 205 may, for example, be generally circular (or matching the top-down view shape of the pins discussed herein). In an example implementation, the conductive pads 205 may comprise one or more layers of various metals (e.g., a titanium layer, a titanium tungsten layer, a copper layer, a nickel layer, a gold layer, etc.). The conductive pads 205 may, for example, comprise die pads, pads of a signal redistribution structure or layer, under bump metallization layer(s), etc.

The conductive pads 205 may comprise any of a variety of physical configurations. For example, as generally shown herein, the conductive pads 205 may have a perimeter border (or lip) that is positioned above and/or over the top dielectric layer 202 of the signal distribution structure 201. The conductive pads 205 may also, for example, have an uppermost surface that is vertically lower than an uppermost surface of the top dielectric layer 202 of the signal distribution structure 201. For example, the top dielectric layer 202 of the signal distribution structure 201 may cover a perimeter portion of the conductive pads 205.

As non-limiting examples, the substrate 210 may utilize inorganic dielectric layers (and/or a combination of inorganic and organic dielectric layers) in the signal distribution structure 201 and a semiconductor material-based support layer 209. The substrate 210 may, for example, be produced utilizing Amkor Technology's Silicon-Less Integrated Module (SLIM™) technology. Also for example, the substrate 210 may, for example, include organic dielectric layers (and/or a combination of inorganic and organic dielectric layers) in the signal distribution structure 201 and a semiconductor material-based support layer 209. The substrate 210 may, for example, be produced utilizing Amkor Technology's Silicon Wafer Integrated Fan-out (SWIFT™) technology. Non-limiting examples of the substrate 210, and the forming thereof, may be found in U.S. patent application Ser. No. 14/823,689, filed Aug. 11, 2015, and titled "SEMICONDUCTOR PACKAGE AND FABRICATING METHOD THEREOF," now U.S. Pat. No. 9,543,242; and U.S. patent application Ser. No. 15/707,646, filed Sep. 18, 2017, and titled "SEMICONDUCTOR PACKAGE AND FABRICATING METHOD THEREOF," each of which is hereby incorporated herein by reference in its entirety Block 110 may, for example, comprise receiving the substrate from an upstream manufacturing process at a same facility or geographical location. Block 110 may also, for example, comprise receiving the substrate from a supplier (e.g., from a foundry, etc.) at a geographically remote site.

In general, block 110 may comprise receiving, fabricating, and/or preparing a substrate. Accordingly, the scope of this disclosure should not be limited by characteristics of any particular type of substrate or by characteristics of any particular manner of receiving, fabricating, and/or preparing a substrate.

The example method 100 may, at block 115, comprise forming solder (or other attachment material). Block 115 may comprise forming solder in any of a variety of manners, non-limiting examples of which are provided herein. Various example aspects of block 115 are presented in the examples 200B-1 and 200B-2 shown at FIGS. 2B-1 and 2B-2, respectively.

Figures 1, 2B:
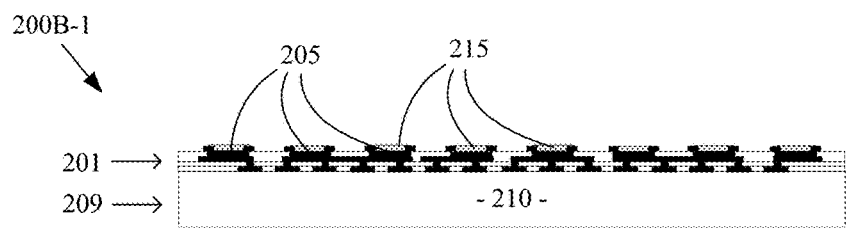

As shown in the example 200B-1 of FIG. 2B-1, block 115 may comprise forming a respective solder member 215 on each of the conductive pads 205. For example, block 115 may comprising forming the solder members 215 by screen printing the solder members 215 (e.g., as a solder paste, etc.) onto the conductive pads 205 through a removable stencil applied to signal distribution structure 201, or otherwise forming the solder members 215. In the example 200B-1, the solder members 215 may comprise flux already integrated therein. For example, an additional fluxing step might not be utilized.

Figures 2, 2B:
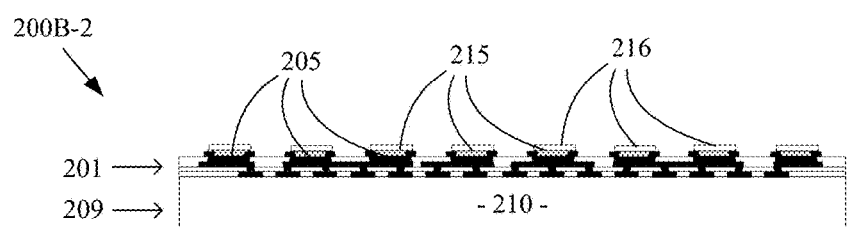

As shown in the example 200B-2 of FIG. 2B-2, block 115 may comprise forming the solder members 215 by plating the solder members 215 on the conductive pads 205 (or otherwise forming the solder members 215). Block 115 may then, for example, comprise forming a respective flux member 216 on each of the solder members 215.

Though various examples shown herein (e.g., with regard to FIGS. 2C and 2D, with regard to FIGS. 4C and 4D, etc.) are based on the example 200B-1 shown in FIG. 2B-1, the example 200B-2 shown in FIG. 2B-2 may be utilized as well.

Also note that although solder is utilized in the example implementations shown herein, other forms of attaching may be utilized without departing from the scope of this disclosure. For example, instead of solder, block 115 may print (or otherwise) apply a conductive adhesive. Also for example, direct solderless metal-to-metal (e.g., copper-to-copper, etc.) bonds may be utilized.

In general, block 115 may comprise forming solder (or other attachment material). Accordingly, the scope of this disclosure should not be limited by characteristics of any particular manner of forming solder (or other attachment material) or by characteristics of any particular type of solder (or other attachment material).

The example method 100 may, at block 120, comprise positioning a pin template and pins. Block 120 may comprise positioning the pin template and pins in any of a variety of manners, non-limiting examples of which are provided herein. Various example aspects of block 120 are presented in the example 200C shown at FIG. 2C.

Figure 2C:
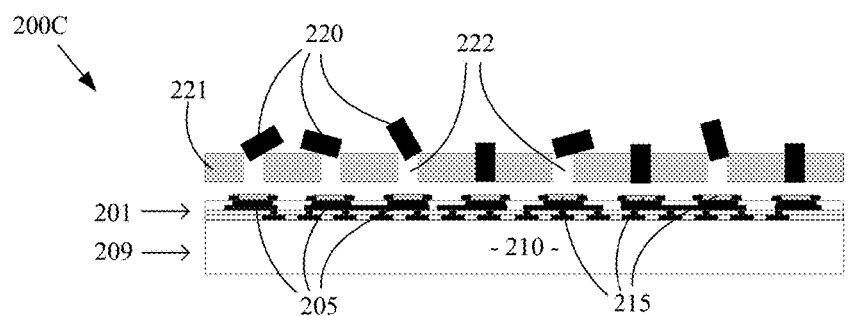
Figure 2D:
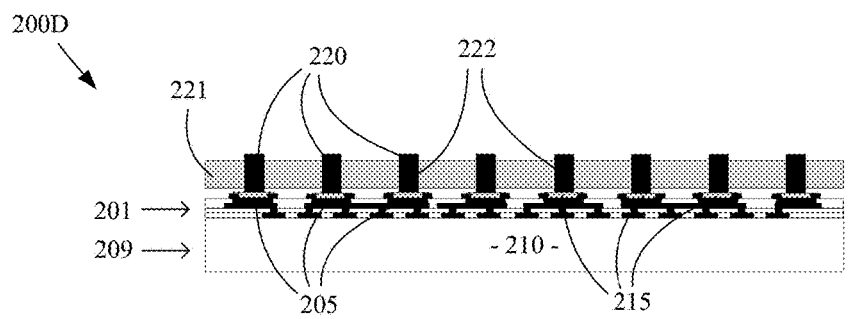
Figure 2E:
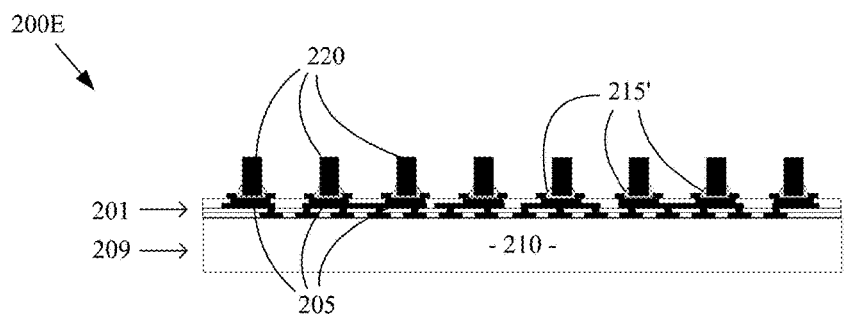

As shown in the example 200C shown in FIG. 2C, block 120 may for example position a pin template 221 (e.g., a metal foil stencil, etc.) over the substrate 210. The pin template 221 may, for example, comprise a plurality of apertures 222, each corresponding to a respective one of the conductive pads 205. Block 120 may, for example, comprise laterally positioning each of the apertures 222 directly over a respective one of the conductive pads 205 (e.g., over a respective solder member 215 and/or flux member 216 on a respective one of the conductive pads 205).

As shown in FIG. 2C, the pin template 221 may be offset from (or elevated off) the substrate 210 enough so that the pin template 221 does not touch the solder members 215 (and/or flux members 216 if present). The pin template 221 may, for example, have a thickness that is less than a height of the pins 220. In an example implementation, the thickness of the pin template 221 combined with the vertical distance between the bottom of the pin template 221 and the top sides of the solder members 215 (and/or flux members 216) may be less than or equal to the height of the pins 220. Such relative dimensions may, for example, limit occupancy of a single aperture 222 to a single pin 220.

A plurality of pins 220 may, for example, be placed on the pin template 221 (e.g., dumped, poured, scooped, blown, etc.). At the example 200C of FIG. 2C, some or all of the pins 220 might not be positioned in respective apertures. Note that although the example 200C illustrates a same number of pins 220 and apertures 222, the pins 220 may outnumber the apertures 222.

The pins 220 may comprise any of a variety of characteristics. For example, the pins 220 may be cylinder-shaped, for example with a circular cross-section and flat top and bottom surfaces. Also for example, the pins 220 may have an oval cross-section, polygonal cross-section, non-circular cross-section, etc. A non-limiting example of the pin 220 is shown in the example 200I-1 of FIG. 2I-1. Such example pin 220 is generally cylinder-shaped with curved (or smooth) transitions 223 between the lateral side and the top and/or bottom ends. The top and/or bottom ends may, for example, be beveled. The example pin 220 shown in FIG. 200I-1 has a diameter of 150 um and a longitudinal height of 300 um. The scope of this disclosure, however, is not limited to any particular dimensions. For example, the pin 220 may have a diameter in the range of 100 um to 250 um. Also for example, the pin 220 may have a height in the range of 50 um to 300 um in diameter. The pin 220 may, for example, have a height that is greater than its width (e.g., diameter, minor axis width, major axis width, etc.), but the scope of this disclosure is not limited thereto.

In various example implementations, the pin 220 will have a diameter that is less than the diameter of the conductive pad 205. For example, the diameter of the pin 220 may be in the range of 10% to 25% less than the diameter of the conductive pad 205. Also for example, the diameter of the pin 220 may be in the range of 25% to 50% less than the diameter of the conductive pad.

In various example implementations, the pin 220 may be substantially thicker than a wirebond wire, which may for example be on the order of 25 um in diameter (e.g., at least two times as thick, at least five times as thick, etc.). Such thickness may provide various benefits. For example, below a certain diameter or size, wires may stick to each other and substantially adversely impact the manufacturing process, and/or such wires may be relatively more susceptible to bending during handling. Also for example, such thickness may provide structural stability not found in a typical wirebond wire, for example during handling and/or encapsulating.

Though the example pin 220 (and all pins herein, pins 420, 520, etc.) are shown with generally flat ends, the scope of this disclosure is not limited thereto. For example, the top and/or bottom ends of the pins may comprise grooves, notches, sawtooth patterns, asperities, etc. Such features may, for example, enhance solderability and/or adherability (e.g., by allowing for the venting of flux vapors or gases, by providing rough surfaces for adhesion, etc.). Also for example, the top and/or bottom ends of the pins may comprise convex or concave shapes, n-sided polygonal shapes, non-vertical sides, etc.

Returning to FIG. 2C, the apertures 222 may for example be generally shaped like the pins 220. For example, the apertures 222 may be cylinder-shaped to match cylinder-shaped pins 220, etc. In an example implementation, the diameter of the apertures 222 may be slightly larger than the diameter of the pins 220 and sized to enhance pin placement temporal efficiency while maintaining placement accuracy. For example, the diameter of the apertures 222 may be in the range of 10 um to 60 um larger (e.g., 40 um larger, 50 um larger, etc.) than the diameter of the pins 220. Also for example, the diameter of the apertures 222 may in the range of 10% to 50% larger (e.g., 25% larger, 33% larger, etc.) than the diameter of the pins 420. Also note that the apertures 222 (e.g., at the upper side of the template 221, etc.) may have curved, sloped, or beveled openings to enhance the filling of the apertures 222 with the pins 220.

The pins 220 may be formed in any of a variety of manners. For example, the pins 220 may, for example, be formed by cutting a wire into segments. The pins 220 may also, for example, be formed by plating, molding, printing, reflowing, depositing, etc.

In general, block 120 may comprise positioning a pin template and pins. Accordingly, the scope of this disclosure should not be limited by characteristics of any particular manner of positioning a pin template and pins or by characteristics of any particular type of pin template and pins.

The example method 100 may, at block 125, comprise positioning pins in pin template apertures. Block 125 may comprise positioning pins in pin template apertures in any of a variety of manners, non-limiting examples of which are provided herein. Various example aspects of block 125 are presented in the example 200D shown at FIG. 2D.

For example, block 125 may comprise vibrating the pin template 221 to jostle the pins 220 until each of the apertures 222 is filled with a respective pin 220. In an example implementation, block 125 may comprise vibrating the pin template 221 in a lateral direction in any of a variety of motion patterns (e.g., in a plane parallel to a general plane of the substrate 210). Note that in various implementations, there may also be a vertical component to the vibrating. The range of the vibration motion may, for example, be a portion of the diameter (or width) of a conductive pad 205 (or solder 215 and/or flux 216 thereof), for example 5-10% of the pad diameter, 1-20% of the pad diameter, etc.). Any of a variety of vibration frequencies may be utilized. For example, a vibration frequency in the range of 1 KHz to 5 KHz (e.g., 2 KHz, 3 KHz, etc.) may be utilized.

Also for example, block 125 may comprise sweeping or brushing the pins 220 over the apertures 222 (e.g., repeatedly) until the apertures 222 are each filled with a respective pin 220. Such sweeping or brushing may, for example, be utilized exclusively or may be combined (e.g., serially or in parallel) with the vibration motion.

In an example implementation, as each pin 220 falls into (or is directly pick-and-placed into) its respective aperture 222, the pin 220 may contact the top side of its respective solder member 215 (or flux member 216). The pin 220 may thus be adhered to its respective solder member 215 (or flux member 216), which may for example be tacky (or sticky). The pin 220 may also, for example, sink into the top side of its respective solder member 215 (or flux member 216).

In general, block 125 may comprise positioning pins in pin template apertures. Accordingly, the scope of this disclosure should not be limited by characteristics of any particular manner of positioning pins in pin template apertures.

Note that in various example implementations, for example in which block 120 positions the pin template with all of the pins already in place prior to the positioning, block 125 may be skipped, and block 120 may comprise placing the template and pins such that the pins are placed in contact with the solder (or flux), for example lowering the template such that the pins 220 each contact their respective solder members 215 (or flux members 216 if present).

The example method 100 may, at block 130, comprise removing the pin template and reflowing the solder. Block 130 may comprise removing the pin template and reflowing the solder in any of a variety of manners, non-limiting examples of which are provided herein. Various example aspects of block 130 are presented in the example 200E shown at FIG. 2E.

For example, block 130 may comprise, before reflowing the solder members 215 (or after such reflowing, in alternative implementations), lifting the pin template 221 upward. As the pin template 221 is lifted upward, the pins 220, which may be adhered to the solder members 215 (or flux members 216 if present), stay in place.

Note that before removal of the pin template 221, excess pins 220 (if any) may be removed from the top side of the pin template 221, removed laterally from an area of the pin template 221 having the apertures 222, etc. Such removal may, for example, be performed by sweeping or brushing, blowing, dumping, vacuuming, etc.

After removal of the pin template 221 (or prior to such removal in alternative implementations), block 130 may comprise reflowing the solder members 215 (e.g., utilizing mass reflow, etc.). It should be noted that other forms of pin attachment, instead of solder, may be utilized without departing from the scope of this disclosure. For example, a conductive adhesive may be applied and cured instead of applying and reflowing solder. Also for example, solderless direct metal-to-metal (e.g., copper-to-copper, etc.) bonding may be utilized to attach the pins 220 to the conductive pads 205.

After the reflowing (or otherwise attaching), each of the pins 220 is fixedly solder-attached to a respective one of the conductive pads 205. Non-limiting examples of such soldered pins are provided in the examples 200I-1 and 200I-2 shown at FIGS. 2I-1 and 2I-2, respectively. Referring to the example 200I-1, the reflowed solder 215' may form a fillet that rises up at least a portion of the lateral side of the pin 220. As shown in FIG. 2I-1, there may be a layer of the reflowed solder 215' that is positioned directly between the pin 220 and the conductive pad 205, separating the pin 220 and the pad 205 from direct contact with each other. In alternative implementations, however, the bottom side of the pin 220 may directly contact the top side of the conductive pad 205. The reflowed solder 215' may, for example, cover the entire top side of the pad 205, but need not.

Referring to the example 200I-2, a smaller amount of solder (relative to the example 200I-1) may be utilized. Utilizing a smaller amount of solder may, for example, reduce electromigration between the solder and the pin metal (e.g., copper, etc.) over time, resulting in a solder joint with enhanced conductivity performance and increased longevity. In the example 200I-2, a space 208 (or volume, or indentation) directly between the perimeter of the bottom end of the pin 220 and the conductive pad 205 may be free of solder. As with the example 200I-1 shown at FIG. 2I-1, there may be a layer of the reflowed solder 215' that is positioned directly between the pin 220 and the conductive pad 205, separating the pin 220 and the pad 205 from direct contact with each other. In alternative implementations, however, the bottom side of the pin 220 may directly contact the top side of the conductive pad 205. The reflowed solder 215' may cover the entire conductive pad 205, but need not. The outer perimeter of the reflowed solder 215' may, for example, extend laterally outside the lateral perimeter of the pin 220, but need not.

In general, block 130 may comprise removing the pin template and reflowing the solder. Accordingly, the scope of this disclosure should not be limited by characteristics of any particular manner of removing a pin template and/or by characteristics of any particular manner of reflowing solder.

The example method 100 may, at block 135, comprise mounting electronic components to the substrate. Block 135 may comprise mounting electronic components to the substrate in any of a variety of manners, non-limiting examples of which are provided herein. Various example aspects of block 135 are presented in the example 200F shown at FIG. 2F, which presents a different cross-section of the device of FIGS. 2A-2E.

For example, block 135 may comprise mounting a semiconductor die 235 to die-mounting pads of the signal distribution structure 201 of the substrate 210. The semiconductor die 235 (or other component(s) may be mounted to the signal distribution structure 201 in any of a variety of manners. For example, conductive bumps 236 (e.g., pillars or posts, C4 bumps, conductive balls, etc.) may be connected to respective die mounting pads 237 utilizing respective solder joints 238 (e.g., mass reflowed joints, thermocompression bonded joints, laser-reflow joints, etc.), utilizing conductive adhesive, utilizing solderless direct metal-to-metal bonds, etc.

Figure 2F:
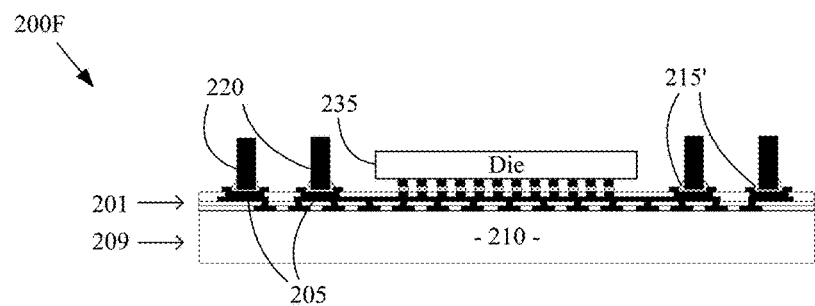

Though only a single semiconductor die 235 is shown in FIG. 2F, the scope of this disclosure is not limited thereto. For example, one or more semiconductor dies and/or one or more passive electronic components (e.g., resistors, capacitors, inductors, etc.) may be mounted to the signal distribution structure 201.

The mounted electronic component(s) may comprise any of a variety of dimensional characteristics. For example, a mounted electronic component may have a thickness that is entirely within the height of the pins 220. Also for example, a mounted electronic component may have a top-side height above the substrate 210 that is less than or equal to the height of a top-side of the pins 220. For example, in an example implementation, a pin 220 may be 300 um tall, and the semiconductor die 235 may be 250 um tall. Note that the scope of this disclosure should not be limited such example dimensions.

As shown in FIG. 2F, a mounted electronic component 235 may be positioned directly laterally between a plurality of the pins 220. A mounted electronic component 235 may also, for example, be laterally surrounded by the pins 220.

Block 135 may comprise attaching the electronic component(s) 235 to the signal distribution structure 201 in any of a variety of manners. For example, block 135 may comprise utilizing reflow attachment, thermocompression bonding (e.g., with or without pre-applied non-conductive paste), adhesive bonding, solderless direct metal-to-metal bonding, etc. For example, block 135 may comprise performing a second reflow different from the reflow performed at block 130. In an example implementation, in addition to forming solder 215 (and/or flux 216) for the pins 220, block 115 may comprise forming solder on die pads and/or other electronic component pads of the signal distribution structure 201. In an example implementation, the pins 220 and the electronic component(s) 235 may all be attached utilizing a single reflow attachment (e.g., holding the pins 220 in place until the electronic component(s) 235 is also placed.

In general, block 135 may comprise mounting electronic components to the substrate. Accordingly, the scope of this disclosure should not be limited by characteristics of any particular manner of mounting electronic components to the substrate or by characteristics of any particular type of electronic component.

The example method 100 may, at block 140, compose encapsulating and thinning. Block 140 may comprise performing the encapsulating and thinning in any of a variety of manners, non-limiting examples of which are provided herein. Various example aspects of block 140 are presented in the example 200G shown at FIG. 2G.

For example, block 140 may comprise forming an encapsulating material 240 utilizing a molding process (e.g., injection molding, compression molding, etc.) and a molding material. Also for example, block 140 may comprise spray-coating, spin-coating, otherwise depositing the encapsulating material 240, etc.

Block 140 may, for example, comprise originally forming (e.g., prior to any thinning process being performed) the encapsulating material 240 to cover top ends of the pins 220 and/or of any or all of the electronic components 235. Also for example, block 140 may comprise originally forming the encapsulating material 240 to a height that exposes the top ends of the pins 220 and/or of any or all of the electronic components(s).

Figure 2G:
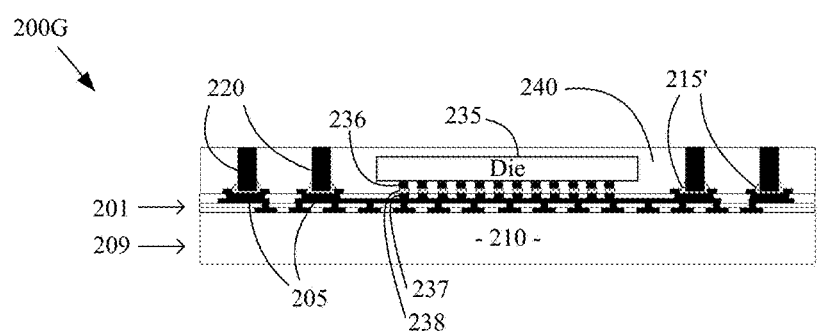
Figure 2H:
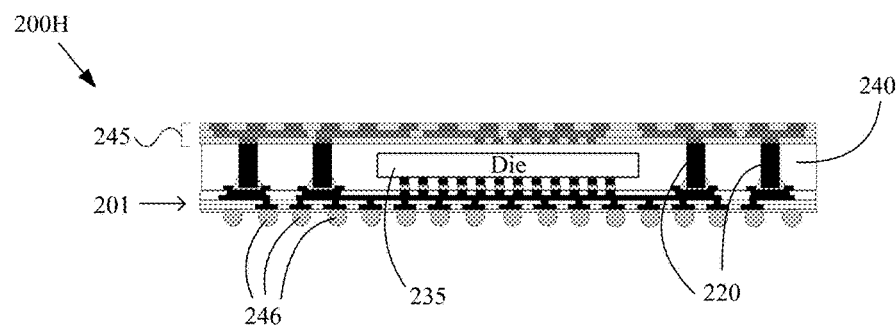
Figures 1, 2I:
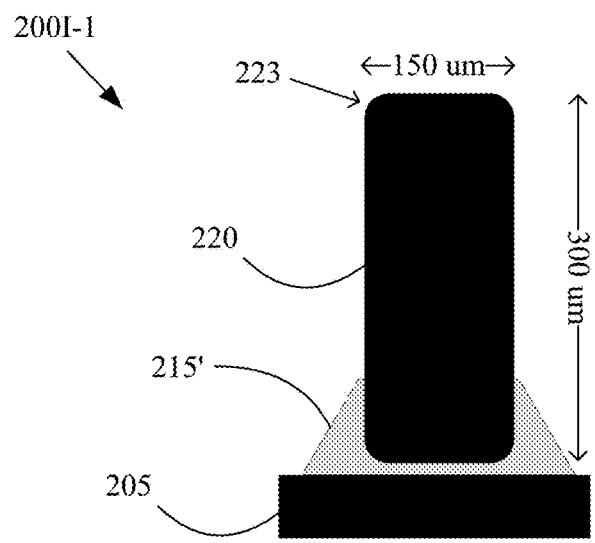
Figures 2, 2I:
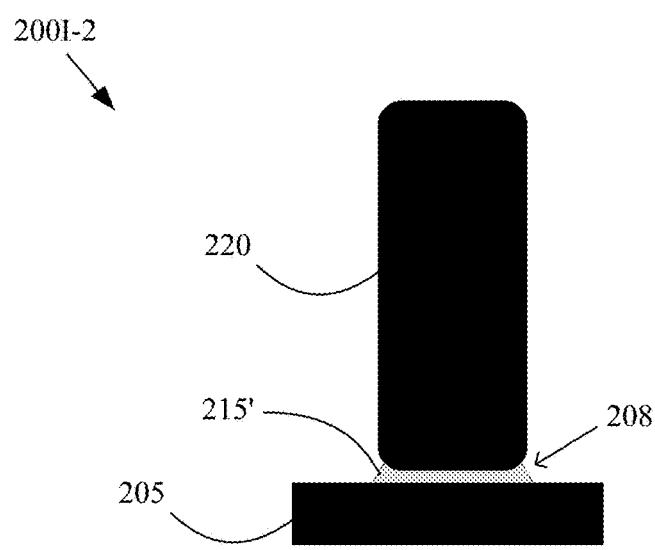

As illustrated in FIG. 2G, block 140 may, for example, comprise thinning (or originally forming) the encapsulating material 240 to expose the top end surfaces of the pins 220. For example, the top surfaces of the pins 220 and the top surface of the encapsulating material 240 may be coplanar.

Though the top side of the example electronic component 235 (e.g., semiconductor die, etc.) is shown covered by the encapsulating material 240, as with the pins 220, the top sides of any one or more electronic components may also be exposed from the encapsulant. For example, the top surfaces of the pins 220, the top surfaces of any or all electronic components 235, and the top surface of the encapsulating material 240 may be coplanar.

Note that during the thinning, block 140 may also comprise thinning the pins 220 and/or the electronic component(s) 235. For example, top ends of the pins 220 (as originally formed) may be ground or abraded off, bulk semiconductor material from the backside of a semiconductor die 235 may be ground or abraded off, etc. For example, in an implementation as shown in the example 200I-1 of FIG. 2I-1, the curved (or smooth) transition 223 may be ground or abraded off, resulting in a pin 220 with a curved (or smooth) transition 223 at the bottom end and a sharp transition between the lateral side and the top end.

Note that in an example implementation in which block 140 comprises originally forming the encapsulating material 240 having the desired final thickness and in which the top sides of any pins 220 or component(s) 235 are originally formed and mounted with the desired final height, a thinning operation may be omitted.

As shown in FIG. 2G, the encapsulating material 240 may laterally surround the pins 220 and the electronic component(s) 235. The encapsulating material 240 may also underfill the electronic component(s) 235, though the electronic component(s) 235 may alternatively be underfilled utilizing a material separate from the encapsulating material 240.

In general, block 140 may comprise encapsulating and thinning. Accordingly, the scope of this disclosure should not be limited by characteristics of any particular manner of encapsulating and/or thinning.

The example method 100 may, at block 145, comprise performing further processing. Block 145 may comprise performing further processing in any of a variety of manners, non-limiting examples of which are provided herein. Various example aspects of block 145 are presented in the example 200H shown at FIG. 2H.

For example, block 145 may comprise forming a top-side signal distribution structure 245 (or redistribution structure) over the pins 220, encapsulating material 240, and/or electronic component(s) 235. Block 145 may comprise forming such a top-side signal distribution structure 245 in any of a variety of manners, many of which were discussed herein with regard to the signal distribution structure 201. For example, top-side signal distribution structure 245 can be built layer by layer (dielectric and conductive layers) atop the device of example 200G, or can be placed there instead as a pre-built unit. Block 145 may also, for example, comprise forming top side pads on (or connected to) the top ends of the pins. Such top side pads may, for example, comprise underbump metallization layers, etc.

Also for example, block 145 may comprise removing the support layer 209 (or carrier) from the substrate 210, leaving the signal distribution structure 201 exposed. For example, bottom side conductive pads may be exposed at the bottom side of the signal distribution structure 201. Block 145 may comprise removing the carrier in any of a variety of manners. For example, block 145 may comprise removing the support layer 209 (or carrier) by grinding, etching, peeling, sheering, melting, planarizing, etc.

Block 145 may then, for example, comprise building additional layers of signal distribution structure on the bottom side of the signal distribution structure 201. Block 145 may also, for example, comprise forming interconnection structures 246 (e.g., conductive balls or bumps, conductive pillars or posts, etc.) on the bottom side of the signal distribution structure 201 (or on the bottom side of any additional signal distribution structure, any underbump metallization, etc., that may have been formed on the bottom of the original signal distribution structure 201).

As discussed herein, any or all of the process steps discussed to this point may be performed on a single substrate or may be performed on a plurality of connected substrates (e.g., on a substrate wafer, on a substrate panel, on a die wafer, etc.). In such a scenario, block 145 may comprise performing a singulating (or cutting, or severing, etc.) operation, in which individual electronic devices (or packages) are separated from other connected electronic devices (or packages). For example, referring to FIG. 2H, block 145 may comprise singulating the example 200H electronic device by cutting along singulation streets of a wafer or panel. Such cutting may, for example, result in lateral sides of the signal distribution structure 201, the encapsulating material 240, and/or the top-side signal distribution structure 245 being coplanar.

In general, block 145 may comprise performing further processing. Accordingly, the scope of this disclosure should not be limited by characteristics of any particular manner of performing further processing.

The example method 100 may, at block 190, comprise continuing the method 100. Such continuing may comprise any of a variety of characteristics, non-limiting examples of which are provided herein.

For example, block 190 may comprise returning execution flow of the example method 100 to any block thereof. Also for example, block 190 may comprise directing execution flow of the example method 100 to any other method block (or step) discussed herein (e.g., with regard to the example method 300 of FIG. 3, FIGS. 4A to 4F-3, FIGS. 5A-5C, etc.).

Figure 3:
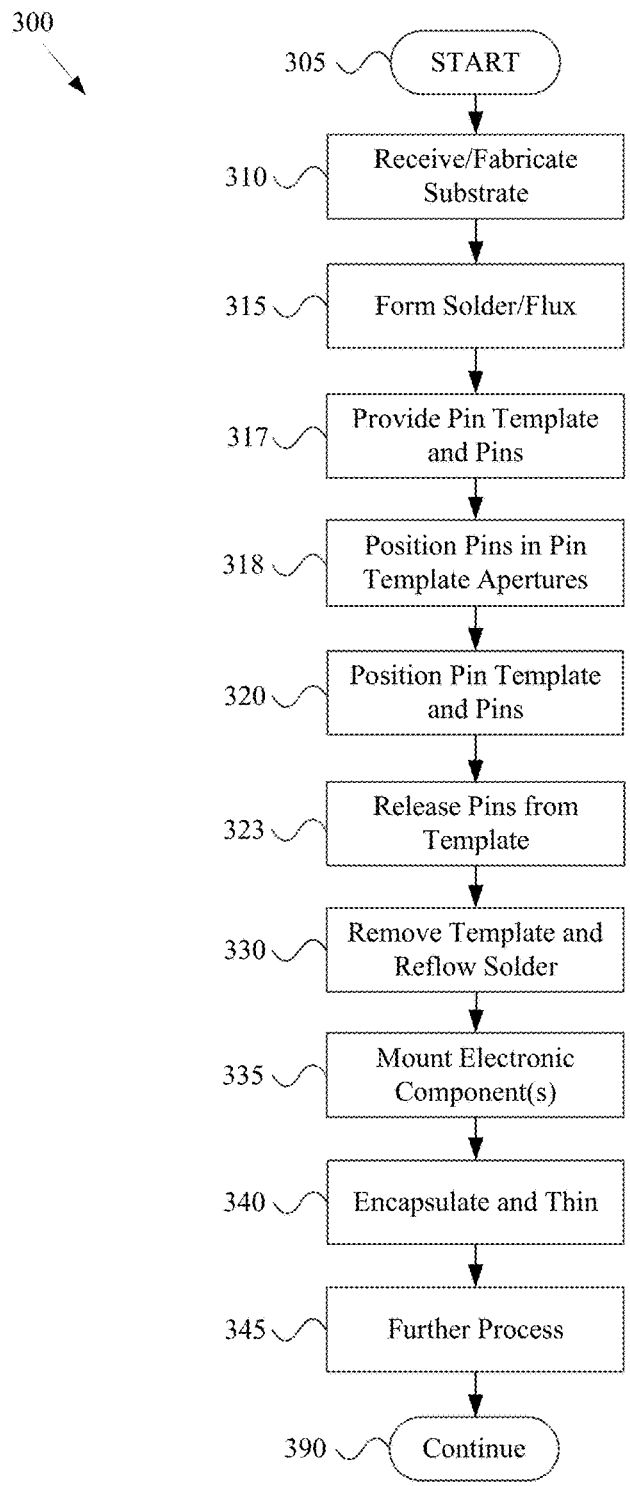
FIG. 3 shows a flow diagram of an example method of making an electronic device, in accordance with various aspects of the present disclosure.

As discussed herein with regard to the pins 220, such pins 220 may comprise any of a variety of shapes and sizes. Additional example shapes of such pins 220 are shown at FIGS. 4F-1 to 4F-3. For example, the pins 220 might comprise a shape and/or dimensions that do not allow the pins 220 to slide completely through the apertures 222 of the pin template 221. An example implementation that applies to pins having such shapes will be discussed next. Note, however, that the example implementation may also be utilized in a scenario in which the pins 220 are able to slide completely through the apertures 222 of the pin template.

Turning now to FIG. 3, such figure shows a flow diagram of an example method 300 of making an electronic device (e.g., a semiconductor package, etc.), in accordance with various aspects of the present disclosure. The example method 300 may, for example, share any or all characteristics with any other example method(s) discussed herein (e.g., the example method 100 of FIG. 1, of FIGS. 2A to 2I-2, of FIGS. 5A-5C, etc.) or any portion thereof. FIGS. 4A to 4F-3 show cross-sectional views illustrating an example electronic device (e.g., a semiconductor package, etc.) and an example method of making an example electronic device, in accordance with various aspects of the present disclosure. FIGS. 4A to 4F-3 may, for example, illustrate an example electronic device at various blocks (or steps) of the method 300 of FIG. 3. FIG. 3 and FIGS. 4A to 4F-3 will now be discussed together. It should be noted that the order of the example blocks of the method 300 may vary without departing from the scope of this disclosure.

The example method 300 may begin executing at block 305. The method 300 may begin executing in response to any of a variety of causes or conditions, non-limiting examples of which are provided herein. For example, the method 300 may begin executing automatically in response to one or more signals received from one or more upstream and/or downstream manufacturing stations, in response to a signal from a central manufacturing line controller, upon arrival of components and/or manufacturing materials utilized during performance of the method 300, etc. Also for example, the method 300 may begin executing in response to an operator command to begin. Additionally for example, the method 300 may begin executing in response to receiving execution flow from any other method block (or step) discussed herein.

The example method 300 may, at block 310, comprise receiving, fabricating, and/or preparing a substrate. Block 310 may comprise receiving, fabricating, and/or preparing a substrate in any of a variety of manners, non-limiting examples of which are provided herein. For example, block 310 may share any or all characteristics with block 110 of the example method 100 shown in FIG. 1 and discussed herein. Various example aspects of block 310 are presented in the example 200A shown at FIG. 2A.

The example method 300 may, at block 315, comprise forming solder (or other attachment material). Block 315 may comprise forming solder in any of a variety of manners, non-limiting examples of which are provided herein. For example, block 315 may share any or all characteristics with block 115 of the example method 100 shown in FIG. 1 and discussed herein. Various example aspects of block 315 are presented in the examples 200B-1 and 200B-2 shown at FIGS. 2B-1 and 2B-2, respectively.

The example method 300 may, at block 317, comprise providing a pin template and pins. Block 317 may comprise providing the pin template and pins in any of a variety of manners, non-limiting examples of which are provided herein. Block 317 may, for example, share any or all characteristics with blocks 120 and 125 of the example method 100 shown in FIG. 1 and discussed herein. Various example of block 317 are also shown in the example 400A shown at FIG. 4A.

Figure 4A:
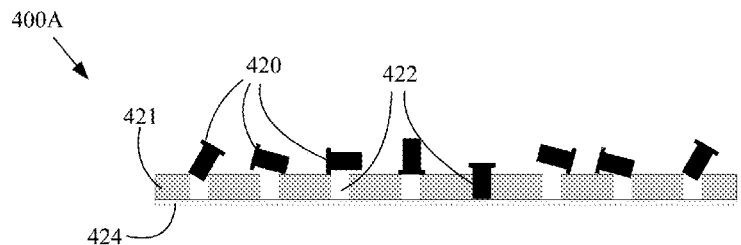
Figure 4B:
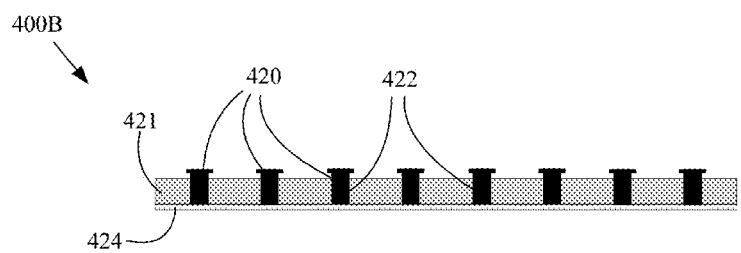

As shown in the example 400A shown in FIG. 4A, block 317 may for example provide a pin template 421. The pin template 421 may, for example, share any or all characteristics with the pin template 221 of FIGS. 2A to 2I-2 discussed herein. The pin template 421 (e.g., a metal foil stencil, stainless steel stencil, electroform nickel stencil, etc.) may, for example, comprise a plurality of apertures 422, each corresponding to a respective one of the pins 420.

The pin template 421 may, for example, have a thickness that is less (or equal to) than a height of the pins 420, less than (or equal to) a height of the main body of the pins 420, etc.

In the example implementation 400A shown in FIG. 4A, an adhesive layer 424 (e.g., an adhesive tape or film, etc.) is adhered to a bottom side of the pin template 421. The adhesive layer 424 may, for example, be utilized to temporarily hold the pins 420 (e.g., when the pins 420 are positioned at block 318) until the pins 420 are released at block 323. Note that other manners of holding the pins 420 in place may also be utilized (e.g., vacuum pressure, electromagnetic force, mechanical holders, gravity, etc.).

A plurality pins 420 may, for example, be placed on the pin template 421 (e.g., dumped, poured, scooped, blown, etc.). At the example 400A of FIG. 4A, some or all of the pins 420 might not be positioned in respective apertures. Note that although the example 400A illustrates a same number of pins 420 and apertures 422, the pins 420 may outnumber the apertures 422.

The pins 420 may comprise any of a variety of characteristics. For example, the pins 420 may share any or all characteristics with the pins 220 discussed herein with regard to FIGS. 2A to 2I-2. For example, the pins 420 may have a cylinder-shaped main body and a head (e.g., like a head of a nail). Also example, the pins 420 (e.g., entire pins, main bodies of pins, heads of pins, etc.) may be cylinder-shaped, for example with a circular cross-section and flat top and bottom surfaces. Also for example, the pins 420 (e.g., entire pins, main bodies of pins, heads of pins, etc.) may have an oval cross-section, polygonal cross-section, non-circular cross-section, etc. A non-limiting example, of the pin 420 is shown in the example 400E-1 of FIG. 4F-1. Such example pin 420 has a main body portion 420a that is generally cylinder-shaped with curved (or smooth) transitions 423 between the lateral side and at least one of the top and/or bottom ends. Such example pin 420 also has a head portion 420b that is generally cylinder-shaped with curved (or smooth) transitions 423 between the lateral side and at least one of the top and/or bottom ends. Note that any of such transitions 423 may be sharp (or comprise a surface discontinuity or sharp corner). The head portion 420b of the example pin 420 of FIG. 4F-1 has a diameter that is greater than the diameter of the main body portion 420a.

The top and/or bottom ends may, for example, be beveled. For example, as shown in the example 400E-3 of FIG. 4F-3, an end of the main body portion 420a opposite the head portion 420b may have a bevel 423'. Any of the ends of the main body portion 420a and/or the head portion 420b may have such a bevel.

The example pin 420 shown in FIG. 400E-1 has main body portion 420a with a diameter of 180 um and a longitudinal height of 210 um, and a head portion 420b with a diameter of 200 um and a longitudinal height of 50 um. The scope of this disclosure, however, is not limited to any particular dimensions.

Returning to FIG. 4A, the apertures 422 may for example be generally shaped like the pins 420 (e.g., like the main body portion 420a of the pin 420). For example, the apertures 422 may be cylinder-shaped to match cylinder-shaped main body portions 420a of the pins, etc. In an example implementation, the diameter of the apertures 422 may be slightly larger than the diameter of the main body portions 420a of the pins 420 and sized to enhance pin placement temporal efficiency while maintaining placement accuracy. For example, the diameter of the apertures 422 may be in the range of 10 um larger (e.g., 40 um larger, 50 um larger, etc.) than the diameter of the pins 420. Also for example, the diameter of the apertures 422 may in the range of 10% to 50% larger (e.g., 25% larger, 33% larger, etc.) than the diameter of the main body portions 420a of the pins 420. Additionally for example, the diameter of the apertures 422 may be smaller than the diameter of the head portions 420b of the pins 420, for example to inhibit the head portions 420b from sliding through the apertures 422 while allowing the main body portions 420a to slide through the apertures 422. Also note that the apertures 422 (e.g., at the upper side of the template 421 as oriented in FIG. 4A, etc.) may have curved, sloped, or beveled openings to enhance the filling of the apertures 422 with the pins 420.

The pins 220 may be formed in any of a variety of manners. For example, the pins 220 may, for example, be formed by cutting a wire into segments and stamping (or compressing) a head portion into each segment. The pins 220 may also, for example, be formed by plating, molding, printing, reflowing, depositing, etc.

In general, block 317 may comprise providing a pin template and pins. Accordingly, the scope of this disclosure should not be limited by characteristics of any particular manner of providing a pin template and pins or by characteristics of any particular type of pin template and pins.

The example method 300 may, at block 318, comprise positioning pins in pin template apertures. Block 318 may comprise positioning pins in pin template apertures in any of a variety of manners, non-limiting examples of which are provided herein. For example, block 318 may share any or all characteristics with block 125 of the example method 100 shown at FIG. 1 and discussed herein. Various example aspects of block 318 are presented in the example 200D shown at FIG. 2D. Various example aspects of block 318 are also presented in the example 400B shown at FIG. 4B.

For example, block 318 may comprise vibrating the pin template 421 to jostle the pins 420 until each of the apertures 422 is filled with a respective pin 420 (e.g., a main body portion 420a of a respective pin 420, etc.). In an example implementation, block 318 may comprise vibrating the pin template 421 in a lateral direction in any of a variety of motion patterns (e.g., in a plane parallel to a general plane of the template 421). Note that in various implementations, there may also be a vertical component to the vibrating. The range of the vibration motion may, for example, be a portion of the diameter (or width) of a conductive pad 205 (or solder 215 and/or flux 216 thereof), for example 5-10% of the pad diameter, 1-20% of the pad diameter, etc.). Any of a variety of vibration frequencies may be utilized. For example, a vibration frequency in the range of 1 KHz to 5 KHz (e.g., 2 KHz, 3 KHz, etc.) may be utilized.

Also for example, block 318 may comprise sweeping or brushing the pins 420 over the apertures 422 (e.g., repeatedly) until the apertures 422 are each filled with a respective pin 420 (or main body portion 420a thereof). Such sweeping or brushing may, for example, be utilized exclusively or may be combined (e.g., serially or in parallel) with the vibration motion.

In an example implementation, as each pin 420 falls into (or is directly pick-and-placed into) its respective aperture 422, pin 420 may contact the top side of the adhesive layer 424. The pin 420 may thus be adhered to the adhesive layer 424 and held in place in its respective aperture 422 of the pin template 421. Note, however, in an example implementation in which the substrate 410 is mated to the pins 420 by positioning the substrate 410 above the pin template 421, the adhesive layer 424 may be skipped (e.g., utilizing gravity to hold the pins 420 in their respective apertures 422, etc.).

In general, block 318 may comprise positioning pins in pin template apertures. Accordingly, the scope of this disclosure should not be limited by characteristics of any particular manner of positioning pins in pin template apertures.

Note that in various example implementations, for example in which block 317 provides the pin template with all of the pins already in place, block 318 may be skipped.

The example method 300 may, at block 320, comprise positioning the pin template and pins (e.g., the pins positioned at block 318). Block 320 may comprise positioning the pin template and pins in any of a variety of manners, non-limiting examples of which are provided herein. Block 320 may, for example, share any or all characteristics with block 120 and/or block 125 of the example method 100 shown at FIG. 1 and discussed herein. Various example aspects of block 320 are presented in the example 200C shown at FIG. 2C. Various example aspects of block 320 are also presented in the example 400C shown at FIG. 4C and discussed herein.

Figure 4C:
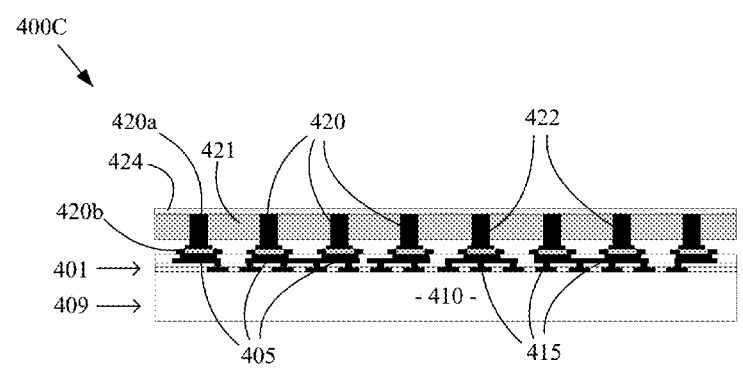

As shown in the example 400C shown in FIG. 4C, block 320 may for example comprise positioning a pin template 421 (e.g., a metal foil stencil, etc.), for example including a plurality of pins 420 positioned in respective apertures 422, adjacent to (e.g., over, under, etc.) the substrate 410. The substrate 410 may share any or all characteristics of the substrate 210 of FIGS. 2A to 2I-2, discussed herein. For example, the substrate 410 may comprise a support layer 409 (or carrier) that shares any or all characteristics of the support layer 409 (or carrier), and a signal distribution structure 401 that shares any or all characteristics of the signal distribution structure 201. Also for example, the substrate 410 may comprise conductive pads 405 that share any or all characteristics with the conductive pads 205 of FIGS. 2A to 2I-2, solder members 415 that share any or all characteristics with the solder members 215 of FIGS. 2B-1 to 2I-2, and/or flux members (not shown) that share any or all characteristics with the flux members 216 of FIG. 2B-2.

Each of the apertures 422 of the pin template 421 may, for example, correspond to a respective pin 421 and correspond to a respective one of the conductive pads 405 of the substrate 410. Block 320 may, for example, comprise laterally positioning each of the apertures 422 (or respective pin 420 thereof) directly adjacent (e.g., directly over, directly under, etc.) a respective conductive pad 405 of the substrate 410 (e.g., over a respective solder member 415 and/or flux member). As shown in the example 400C of FIG. 4C, an end surface of a head portion 420b of each pin 420 contacts and is adhered to a respective solder member 415 (and/or flux member if present) of a respective conductive pad 405. At the same time an end surface of a main body portion 420a of each pin 420 is adhered to the adhesive layer 424.

As shown in FIG. 4C, the pin template 421 may be elevated (or offset) from the substrate 410 enough so that the pin template 421 does not touch the solder members 415 (and/or flux members if present). Such height or offset may, for example, be controlled at the edges of the stencil, by offset members connected to the bottom of the stencil, by tie members connected to the top of the stencil, etc. The pin template 421 may, for example, have a thickness that is less than a height of the pins 420. In an example implementation, the thickness of the pin template 421 may, for example, be less than or equal to a longitudinal length of a main body portion 420a of a pin 420.

It should be understood that although in FIG. 4C, the pin template 421 is positioned over the substrate 410, in another example implementation, the substrate 410 may be positioned over the pin template (e.g., generally inverting the diagram shown in FIG. 4C). As mentioned herein, in such an example implementation, the adhesive layer 424 may be skipped, but need not be.

In general, block 320 may comprise positioning the pin template and pins. Accordingly, the scope of this disclosure should not be limited by characteristics of any particular manner of positioning a pin template and pins or by characteristics of any particular type of pin template and pins.

The example method 300 may, at block 323, comprise releasing the pins from the pin template. Block 323 may comprise releasing the pins from the pin template in any of a variety of manners, non-limiting examples of which are provided herein. Block 323 may, for example, share any or all characteristics with block 130 of the example method 100 shown at FIG. 1 and discussed herein. Various example aspects of block 323 are presented in the example 200E shown at FIG. 2E. Various example aspects of block 323 are also presented in the example 400D shown at FIG. 4D and discussed herein.

Figure 4D:
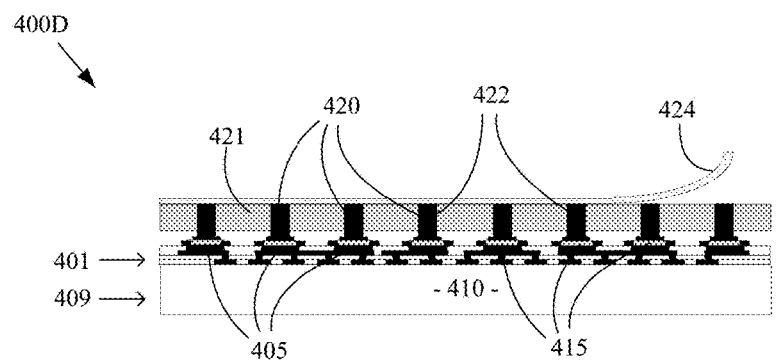
Figure 4E:
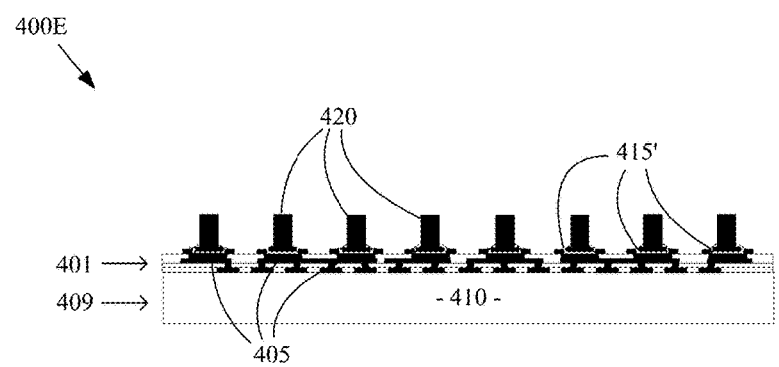

For example, as shown at FIG. 4D, block 323 may comprise peeling (or otherwise removing) the adhesive layer 424 (e.g., an adhesive tape or film, etc.) from the top side of the pin template 421 and from the top ends of the pins 420 (as oriented in FIG. 4D). Block 323 may also, for example, comprise utilizing chemical means to remove the adhesive layer 424, applying temperature to release the adhesive layer 424, applying light energy to release the adhesive layer 424, etc. Removing the adhesive layer 424 may, for example, remove a mechanical coupling between the pins 420 and the pin template 421.

As discussed herein, other manners of holding the pins 420 in place in the pin template 421 may be utilized (e.g., vacuum pressure, electromagnetic force, mechanical holders, gravity, etc.). In such implementations, block 323 may for example comprise releasing vacuum pressure (and/or reversing such vacuum), removing any electromagnetic force or mechanical holder keeping the pins 420 in place, etc.

In general, block 323 may comprise releasing the pins from the pin template. Accordingly, the scope of this disclosure should not be limited by characteristics of any particular manner of releasing a pin from a pin template.

The example method 300 may, at block 330, comprise removing the pin template and reflowing the solder. Block 330 may comprise removing the pin template and reflowing the solder in any of a variety of manners, non-limiting examples of which are provided herein. For example, block 330 may share any or all characteristics with block 130 of the example method 100 shown at FIG. 1 and discussed herein. Various example aspects of block 330 are presented in the example 200E shown at FIG. 2E. Various example aspects of block 330 are also presented in the example 400E shown at FIG. 4E.

For example, block 330 may comprise, before reflowing the solder members 415 (or after such reflowing, in alternative implementations), lifting the pin template 421 upward. As the pin template 421 is lifted upward, the pins 420, which may be adhered to the solder members 415 (or flux members if present) stay in place.

After removal of the pin template 421 (or prior to such removal in alternative implementations), block 330 may comprise reflowing the solder members 415 (e.g., utilizing mass reflow, etc.). It should be noted that other forms of pin attachment, instead of solder, may be utilized without departing from the scope of this disclosure. For example, a conductive adhesive may be applied and cured instead of applying and reflowing solder. Also for example, solderless direct metal-to-metal (e.g., copper-to-copper, etc.) bonding may be utilized to attach the pins to the conductive pads.

After the reflowing, each of the pins 421 is fixedly solder-attached to a respective one of the conductive pads 405. Non-limiting examples of such soldered pins are provided in the examples 400E-1, 400E-2, and 400E-3 shown at FIGS. 4F-1, 4F-2, and 4F-3, respectively. Referring to the example 400E-1, the reflowed solder 415' may form a fillet that rises up at least a portion of the lateral side of the pin 420 (e.g., at least a portion of the lateral side of the head portion 420b of the pin 420, etc.). As shown in FIG. 4F-1, there may be a layer of the reflowed solder 415' that is positioned directly between the pin 420 (e.g., a head portion 420b of the pin 420, etc.) and the conductive pad 405, separating the pin 420 and the pad 405 from direct contact with each other. In alternative implementations, however, the bottom side of the pin 420 (e.g., a bottom side of a head portion 420b of the pin 420, etc.) may directly contact the top side of the conductive pad 405. The reflowed solder 415' may cover the entire pad 405, but need not.

Referring to the example 400E-2, a smaller amount of solder (relative to the example 400E-1) may be utilized. Utilizing a smaller amount of solder may, for example, reduce electromigration between the solder and the pin metal (e.g., copper, etc.) over time, resulting in a solder joint with enhanced conductivity performance and increased longevity. In the example 400E-2, a space 408 (or volume or indentation) directly between the perimeter of the bottom end of the pin 420 (e.g., a bottom end of the head portion 420b of the pin 420, etc.) and the conductive pad 405 may be free of solder. As with the example 400E-1 shown at FIG. 4F-1, there may be a layer of the reflowed solder 415' that is positioned directly between the pin 420 (e.g., a head portion 420b of the pin 420, etc.) and the conductive pad 405, separating the pin 420 and the pad 405 from direct contact with each other. In alternative implementations, however, the bottom side of the pin 420 (e.g., the bottom side of a head portion 420b of the pin 420, etc.) may directly contact the top side of the conductive pad 405. The reflowed solder 415' may cover the entire conductive pad 405, but need not. The outer perimeter of the reflowed solder 415' may, for example, extend laterally outside the lateral perimeter of the pin 420 (e.g., laterally outside a lateral perimeter of a head portion 420b of the pin 420, etc.), but need not.

In general, block 330 may comprise removing the pin template and reflowing the solder. Accordingly, the scope of this disclosure should not be limited by characteristics of any particular manner of removing a pin template and/or by characteristics of any particular manner of reflowing solder.

The example method 300 may, at block 335, comprise mounting electronic components to the substrate. Block 335 may comprise mounting electronic components to the substrate in any of a variety of manners, non-limiting examples of which are provided herein. For example, block 335 may share any or all characteristics with block 135 of the example method 100 shown in FIG. 1 and discussed herein. Various example aspects of block 335 are presented in the example 200F shown at FIG. 2F (e.g., with the attached pins 420 of FIG. 4E, etc.).

The example method 300 may, at block 340, compose encapsulating and thinning. Block 340 may comprise performing the encapsulating and thinning in any of a variety of manners, non-limiting examples of which are provided herein. For example, block 340 may share any or all characteristics with block 140 of the example method 100 shown in FIG. 1 and discussed herein. Various example aspects of block 340 are presented in the example 200G shown at FIG. 2G (e.g., with the attached pins 420 of FIG. 4E, etc.).

The example method 300 may, at block 345, comprise performing further processing. Block 345 may comprise performing further processing in any of a variety of manners, non-limiting examples of which are provided herein. For example, block 345 may share any or all characteristics with block 145 of the example method 100 shown in FIG. 1 and discussed herein. Various example aspects of block 345 are presented in the example 200H shown at FIG. 2H (e.g., with the attached pins 420 of FIG. 4E, etc.).

The example method 300 may, at block 390, comprise continuing the method 300. Such continuing may comprise any of a variety of characteristics, non-limiting examples of which are provided herein.

For example, block 390 may comprise returning execution flow of the example method 300 to any block thereof. Also for example, block 390 may comprise directing execution flow of the example method 300 to any other method block (or step) discussed herein (e.g., with regard to the example method 100 of FIG. 1, FIGS. 2A to 2I-2, FIGS. 5A-5C, etc.).

As discussed herein, for example in either of the example methods 100 and 300 discussed herein, the substrate on which the pins are mounted may comprise an active semiconductor die (or wafer thereof), and the pins may be mounted to pads on the active surface of such die (or wafer thereof). Also for example, the pins may be mounted to a signal distribution layer that has been formed over the active surface of the die. Note that in various other implementations, for example incorporating through silicon via or other signal routing technology, the pins may be mounted to the backsides of various types of semiconductor dies.

Figure 5A:
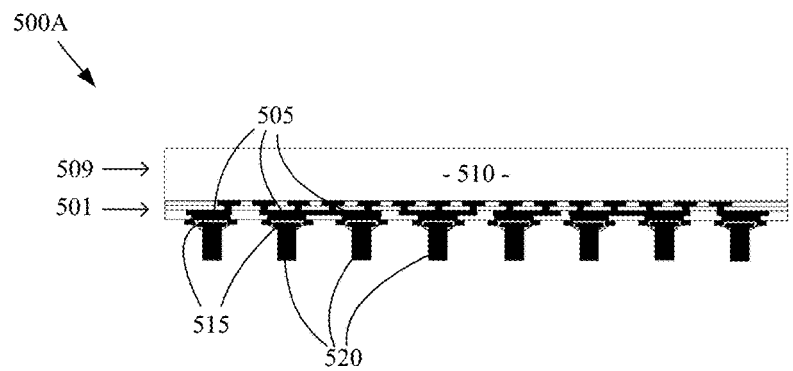
FIGS. 5A to 5C show cross-sectional views illustrating an example electronic device and an example method of making an example electronic device, in accordance with various aspects of the present disclosure.
Figure 5B:
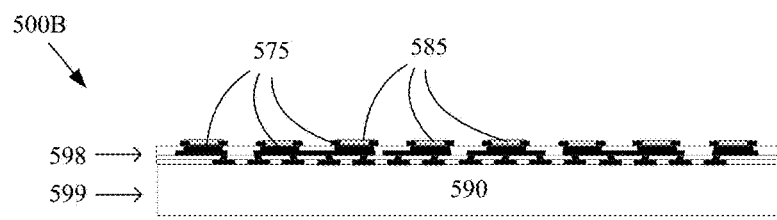
Figure 5C:
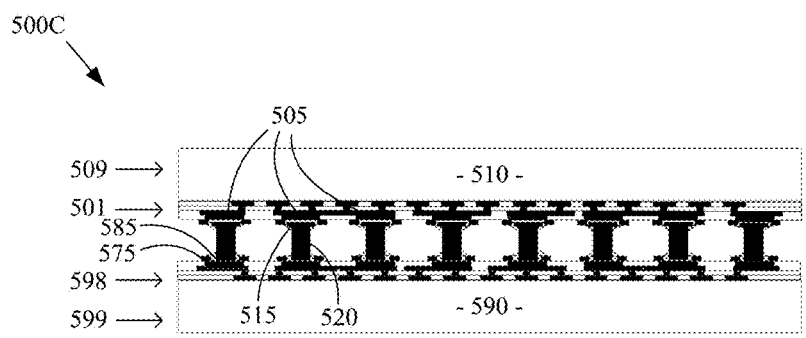

In such an example, a semiconductor die having the pins attached thereto may then be coupled to another substrate (e.g., a motherboard, a laminate substrate, a printed circuit board (PCB), a package substrate, another package, another die, etc.). FIGS. 5A to 5C provides examples 500A, 500B, and 500C of such operations. The example methods and structures shown in FIGS. 5A to 5C may, for example, share any or all characteristics with the example methods and structures shown in FIG. 1, FIGS. 2A to 2I-2, FIG. 3, FIGS. 4A to 4F-3, etc.

The example 500A of FIG. 5A may, for example, share any or all characteristics with the examples 200E and 400E of FIGS. 2 and 4, and discussed herein. In this example, the support layer 509 (or carrier) may include bulk semiconductor material, at least some of which may be permanent material of the completed electronic device. The example 500A also includes the signal distribution structure 501, conductive pads 505, solder members 515, and pins 520, many examples of which have been provided herein.

The example 500B of FIG. 5B shows providing a substrate 590 on which the example 500A will be mounted. The example substrate 590 comprises a base 599, a signal distribution structure 598 including various dielectric and conductive layers, and conductive pads 575. The example substrate 590 may, for example, share any or all characteristics with any other substrate discussed herein (e.g., substrate 210, etc.). The example substrate 590 may, for example, comprise a package substrate, a motherboard, a laminate substrate, a printed circuit board (PCB), a coreless substrate, another package, another die, etc.).

The example 500B also includes solder members 585 formed on the conductive pads 575. Note that as discussed herein, flux members may be added. The solder members 585 may comprise any of a variety of characteristics. For example, the solder members 585 may share any or all characteristics with any of the solder members discussed herein (e.g., solder member 215, etc.) Also note that, as discussed herein, any of a variety of forms of attachment may be utilized (e.g., conductive epoxy, solderless metal-to-metal bonds, etc.).

The example 500C of FIG. 5C shows the example 500A (as shown in FIG. 5A) coupled to the substrate 590 (of the example 500B shown in FIG. 5B), for example, by positioning the pins 530 in contact with the solder members 585 and performing a reflow process. Note that any of a variety of other operations may be performed (e.g., underfilling between the substrates 510 and 590, molding, forming additional signal distribution structures, forming interconnection structures, singulating, etc.).

In summary, various aspects of this disclosure provide an electronic device and a manufacturing method thereof. As non-limiting examples, various aspects of this disclosure provide an electronic device having a top side pin array, for example which may be utilized for three-dimensional stacking, and a method for manufacturing such an electronic device. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing an electronic device, the method comprising:

receiving a substrate that comprises a plurality of pads and a plurality of solder members, each solder member of the plurality of solder members positioned on a respective pad of the plurality of pads;

positioning a pin template comprising a plurality of apertures above the substrate such that each aperture of the plurality of apertures aligns with a respective pad of the plurality of pads;

placing a plurality of pins on an upper surface of the pin template;

moving the plurality of pins with respect to the upper surface of the pin template such that each pin of the plurality of pins falls into a respective aperture of the plurality of apertures;

lifting the pin template away from the substrate and the plurality of pins; and attaching the plurality of pins to the plurality of pads by reflowing the plurality of solder members.

2. The method of claim 1, further comprising removing a temporary carrier from a signal distribution structure of the substrate.

3. The method of claim 2, further comprising mounting a semiconductor die to the signal distribution structure.

4. The method of claim 1, wherein said moving the the plurality of pins comprises vibrating the pin template.

5. The method of claim 1, wherein said positioning the pin template above the substrate is performed before said placing the plurality of pins.

6. The method of claim 1, wherein each pin of the plurality of pins is cylinder-shaped.

7. The method of claim 6, wherein each pin of the plurality of pins comprises a curved transition between an end surface and a side surface.

8. The method of claim 1, wherein:

each aperture of the plurality of apertures has an aperture diameter; and each pin of the plurality of pins comprises a cylinder-shaped main body having a body diameter that is less than the aperture diameter, and a head having a head diameter that is greater than the aperture diameter.

9. The method of claim 1, further comprising:

holding each pin of the plurality of pins in the respective aperture of the plurality of apertures with an adhesive tape; and removing the adhesive tape after said positioning the pin template above the substrate.

10. The method of claim 1, wherein after said reflowing the solder members, each reflowed solder member comprises a portion that lies between its respective pad and its respective pin.

11. The method of claim 1, further comprising:

coupling a semiconductor die to the substrate and positioned laterally between at least two pins of the plurality of pins; and encapsulating the semiconductor die and the plurality of pins in an encapsulating material.

12. A method of manufacturing an electronic device, the method comprising:

receiving a substrate that comprises a plurality of pads;

placing a plurality of pins on a pin template comprising a plurality of apertures;

moving each pin of the plurality of pins such that each pin falls into a respective aperture of the plurality of apertures;

aligning the plurality of apertures with a respective pad of the plurality of pads; and attaching each pin of the plurality of pins to its respective pad.

13. The method of claim 12, wherein each pad of the plurality of pads has a respective solder member thereon prior to said aligning.

14. The method of claim 12, wherein said aligning comprises positioning the pin template above the substrate prior to said moving each pin of the plurality of pins.

15. The method of claim 14, further comprising holding each pin of the plurality of pins in its respective aperture prior to said positioning the pin template above the substrate.

16. The method of claim 12, wherein after said attaching, a layer of solder lies between each pin of the plurality of pins and its respective pad.

17. A method of manufacturing an electronic device, the method comprising:
    providing a pin template comprising a plurality of apertures;
    positioning the pin template above a substrate such that the plurality of apertures align with a plurality of pads of the substrate;
    moving a plurality of pins in relation to the pin template such that each pin of the plurality of pins is positioned in a respective aperture of the plurality of apertures and aligned with a respective pad of the plurality of pads; and
    soldering each pin of the plurality of pins to said respective pad of the substrate.

18. The method of claim 17, further comprising removing a temporary carrier from a signal distribution structure of the substrate after said soldering.

19. The method of claim 18, further comprising mounting a semiconductor die that comprises active semiconductor circuitry to the signal distribution structure.

* * * * *